United States Patent
Takeya et al.

(10) Patent No.: US 6,452,527 B2
(45) Date of Patent: Sep. 17, 2002

(54) CURRENT ADDING TYPE D/A CONVERTER

(75) Inventors: Akifumi Takeya, Tokyo; Tomoyuki Katada, Kawasaki, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/893,278

(22) Filed: Jun. 27, 2001

(30) Foreign Application Priority Data

Jun. 28, 2000 (JP) ........................................ 2000-194624

(51) Int. Cl.⁷ ................................................ H03M 1/66
(52) U.S. Cl. ........................................ 341/144; 341/153
(58) Field of Search ................................ 341/133, 136, 341/144, 153

(56) References Cited

U.S. PATENT DOCUMENTS

| | | | | |
|---|---|---|---|---|
| 3,995,304 A | * | 11/1976 | Pease | 341/144 |
| 4,695,826 A | | 9/1987 | Ando et al. | |
| 4,864,215 A | * | 9/1989 | Schouwenaars et al. | 341/144 |
| 5,949,362 A | * | 9/1999 | Tesch et al. | 341/144 |

FOREIGN PATENT DOCUMENTS

| | | |
|---|---|---|
| JP | 61-240716 | 10/1986 |
| JP | 2-253719 | 10/1990 |
| JP | 5-191289 | 7/1993 |
| JP | 5-259916 | 10/1993 |
| JP | 2000-188550 | 7/2000 |

\* cited by examiner

*Primary Examiner*—Howard L. Williams
(74) *Attorney, Agent, or Firm*—Pearne & Gordon LLP

(57) ABSTRACT

In a plurality of current cells 101 to 116 of a current adding type D/A converter, a switching sequence is determined in such a manner that current cells having large fluctuations of output currents (namely, current cells 101 and 116 located on both sides) are turned ON in the order corresponding to such a value nearly equal to either a maximum value or a minimum value of input data, whereas current cells having small fluctuations (current cells 108 and 109 located in the vicinity of center point) are turned ON in the order of such a value near a center point. At this time, the switching sequence is determined under such a condition that differences contained in fluctuations of output current amounts as to pairs of such current cells whose ON-sequences are adjacent to each other are made constant. Namely, in the respective paired current cells, a summation of array numbers is equal to 17 defined by a total current cell number+1 (16+1), namely becomes constant.

7 Claims, 10 Drawing Sheets

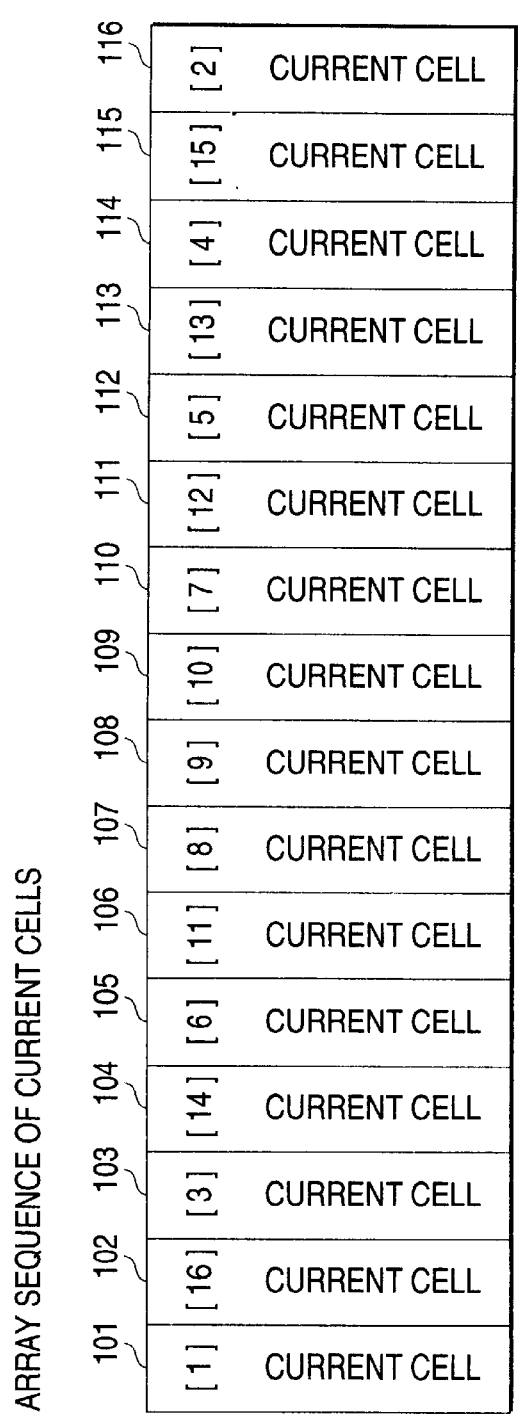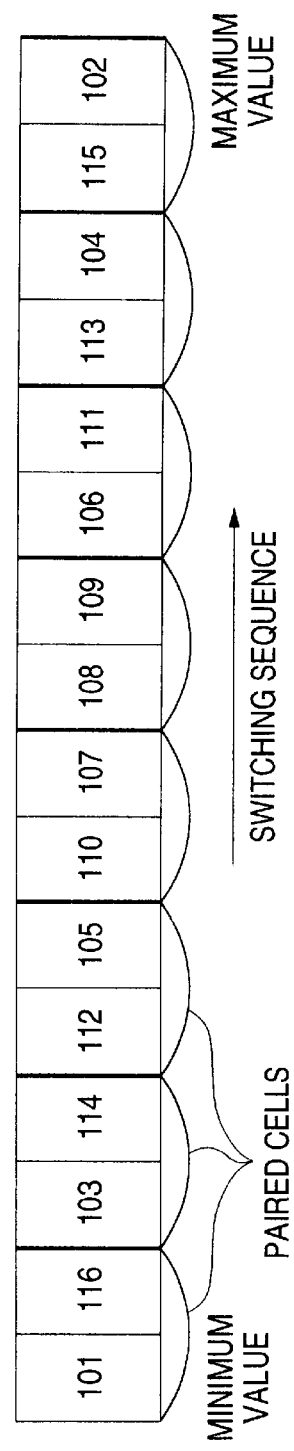
FIG. 1 (A)
FIG. 1 (B)

FIG. 9 (A)

ARRAY SEQUENCE OF CURRENT CELLS

| Index | Cell | [n] |
|---|---|---|
| 501 | CURRENT CELL | [2] |
| 502 | CURRENT CELL | [4] |
| 503 | CURRENT CELL | [6] |
| 504 | CURRENT CELL | [8] |
| 505 | CURRENT CELL | [10] |
| 506 | CURRENT CELL | [12] |
| 507 | CURRENT CELL | [14] |
| 508 | CURRENT CELL | [16] |
| 509 | CURRENT CELL | [1] |
| 510 | CURRENT CELL | [3] |
| 511 | CURRENT CELL | [5] |
| 512 | CURRENT CELL | [7] |
| 513 | CURRENT CELL | [9] |
| 514 | CURRENT CELL | [11] |
| 515 | CURRENT CELL | [13] |
| 516 | CURRENT CELL | [15] |

FIG. 9 (B)

SWITCHING SEQUENCE OF CURRENT CELLS

| Order | Cell |
|---|---|
| 509 | MINIMUM VALUE |
| 501 | |
| 510 | |
| 502 | |
| 503 | |
| 511 | |
| 504 | |
| 512 | |
| 505 | |
| 513 | |
| 506 | |
| 514 | |
| 507 | |
| 515 | |
| 516 | |
| 508 | MAXIMUM VALUE |

SWITCHING SEQUENCE ↑

CURRENT ADDING TYPE D/A CONVERTER

BACKGROUND OF THE INVENTION

1. Field of the Invention

[Technical Field to Which the Invention Belongs]

The present invention relates to a current adding type D/A converter equipped with a plurality of current cells made by employing constant current sources, and more specifically, is related to an improvement in a differential linearity error occurred in the D/A converter.

2. Description of the Related Art

As D/A converters capable of performing digital-to-analog converting operations, current adding D/A converters are widely used. As viewed from an aspect of conversion precision, in an ideal current adding type D/A converter, all of magnitudes of output currents derived from the respective current cells are made equal to each other. However, in an actual case, since transistor characteristics are fluctuated due to manufacturing process of the transistors, the magnitudes of the output currents derived from the respective current cells are not made constant. As a result, while differential linearity errors and also non-linear errors (integral linearity errors) will occur, these errors may depend upon the output current amounts of the respective current cells. In general, fluctuations contained in output current amounts are changed along a predetermined direction, depending upon an arrangement of current cells, namely, the fluctuations are increased, or decreased in a linear manner, depending upon the current cell arrangement. In other words, in a plurality of arrayed current cells, an output current characteristic defined from a current cell positioned at one end up to a current cell positioned at the other end is changed in the linear manner. For example, Japanese Laid-open Patent Application No. Hei-5-191289 discloses such an arrangement that the increase of the integral linearity errors may be suppressed by switching the respective current cells in the discrete manner.

Now, a structural example of a conventional current adding type D/A converter is represented. FIG. 9 is an explanatory diagram for showing an arranging structural example of current cells of the current adding type D/A converter. This example indicates such a case that a total number of current cells is equal to 16. FIG. 9(A) shows an array sequence of the current cells, and FIG. 9(B) represents a switching sequence of the current cells.

For instance, a current cell 501 through a current cell 516 are made of the same current cells. As indicated in this drawing, each of these current cells is constituted by employing a constant current source and a switch used to turn ON this constant current source. These current cells are arranged in the form of, for example, one column in this order of reference numerals 501 to 516. These reference numerals 501 to 516 correspond to array numbers of the current cells. Also, numerals [1] to [16] denoted on the respective current cells in FIG. 9(A) correspond to switching numbers, namely represent such a sequence that the current cells are switched. FIG. 9(B) shows current cells which are arranged by rearranging the above-described current cells of FIG. 9(A) in another switching order as shown in FIG. 9(B). Reference numerals denoted in the respective current cells show array numbers.

Now, a description will be made of operations of the current adding type D/A converter arranged in the above manner. In the current adding type D/A converter, when digital input data as a D/A conversion input is under no signal state (in this case, this signal state is assumed as "0"), all of the switches of the current cells are turned OFF. In the case that the input data is "1", the switch of the current cell 509 is turned ON, so that a current is outputted from this current cell 509. When the input data is "2", both the switches of the current cell 509 and the current cell 501 are turned ON, so that a current equal to two sets of these current cells are outputted. Furthermore, while the data is increased, in accordance with the sequence of the switching number, the current cell 510, the current cell 502, the current cell 511, the current cell 503, the current cell 512, the current cell 504, the current cell 513, the current cell 505, the current cell 514, the current cell 506, the current cell 515, the current cell 507, and the current cell 516 are sequentially turned ON, so that output currents from the current cells are added to each other. In such a case that the input data becomes 16, the current cell 508 is turned ON, so that since all of the 16 current cells are turned ON, the maximum current may flow.

As previously explained, in response to the value of the input data, the summation of the current amounts flowing from a plurality of current cells is controlled. This current is converted into a voltage by an output resistor, so that the D/A converting operation as to the input data is carried out. Thus, the analog output signal can be obtained with respect to the digital input data.

FIG. 10 is a graphic representation for representing a differential linearity error occurred in the case that the respective current cells are switched in the switching sequence shown in FIG. 9. In this graph, such differential linearity errors are indicated every output value when 1LSB is selected to be 1 in such a case that the output current amounts of the respective current cells are changed by 1% due to the cell arrangement. In FIG. 10, an ordinate indicates a magnitude of the differential linearity errors. An abscissa indicates a magnitude of total output current amounts (namely, total number of current cells which are turned ON and correspond to magnitude of input data). As indicated in this drawing, the differential linearity errors are made uniform over the entire output range.

As previously explained, in the conventional current adding type D/A converter, with respect to the fluctuations which are caused by the arrangement of the output current characteristics of the respective current cells, the entire differential linearity error can be made substantially uniform by switching the current cells in the discrete manner.

However, in the circuit arrangement of the conventional D/A converter, the precision with respect to the input data in the vicinity of the normally-used center point (namely, intermediate point between maximum value and minimum value) is made substantially identical to the precision with respect to the input data in the vicinity of both the maximum value and the minimum value, whose use frequency degrees are low. There is such a problem that the differential linearity errors occurred in the vicinity of the center point are large, especially, which may constitute the major factor of the D/A converter performance.

In a signal processing system equipped with a D/A converter, there are many cases that such signals (for instance, periodic signals such as audio signals) are employed, and these signals own positive amplitudes and negative amplitudes on the maximum side and the minimum side, while sandwiching a center point. In the case that the D/A converter is applied to such a signal processing system, the D/A converter requires higher precision while the signal has the smaller amplitude than that while the signal owns the large amplitude, as viewed from the SIN aspect and the distortion aspect. Such a consideration as to the characteristic while the signal owns the small amplitude is not made in this conventional current adding type D/A converter. Since the absolute value of the differential linearity errors occurred in the vicinity of the center point is large which corresponds to the signal having the small amplitude, the desirable performance of this D/A converter could not be obtained.

SUMMARY OF THE INVENTION

The present invention has been made to solve the above-explained problems, and therefore, has an object to provide such a current adding type D/A converter capable of improving characteristics thereof in the normally-used range such as while a signal has a small amplitude, which this D/A converter is capable of reducing differential linearity errors occurred in the vicinity of a center point of input data.

A current adding type D/A converter, according to a first aspect of the present invention, is featured by that in such a current adding type D/A converter having a plurality of current cells made by employing a plurality of constant current sources and a plurality of switches for turning ON the constant current sources, wherein: the current adding type D/A converter is comprised of switch control means; and wherein: in such a case that array numbers defined from "1" to "n" are applied to the plural current cells in the arranging order of the current cells, and the array number "n" is equal to the even number as well as "n/2" is equal to the even number, while combinations of the array numbers in which a summation of two array numbers becomes (n+1) are prepared within the plurality of current cells, an array of the array numbers is formed in such a manner that array numbers on the odd number side, or the even number side among the combinations of the current cells are arrayed from a smaller array number; and also the switch control means controls to turn ON the switches of the current cells in accordance with the array sequence, or another array sequence opposite to the array sequence.

A current adding type D/A converter, according to a second aspect of the present invention, is featured by that in such a current adding type D/A converter having a plurality of current cells made by employing a plurality of constant current sources and a plurality of switches for turning ON the constant current sources, wherein: the current adding type D/A converter is comprised of switch control means; and wherein: in such a case that array numbers defined from "1" to "n" are applied to the plural current cells in the arranging order of the current cells, and the array number "n" is equal to the even number as well as "n/2" is equal to the odd number, while combinations of the array numbers in which a summation of two array numbers becomes (n+1) except for both the array number "1" and the array number "n" are prepared within the plurality of current cells, and further, the array number "1" is set as either a top number or a last number, an array of the array numbers is formed in such a manner that array numbers on the odd number side, or the even number side among the combinations of the current cells are arrayed from a smaller array number and the array number "n" is arrayed as either the last number or the top number; and also the switch control means controls to turn ON the switches of the current cells in accordance with the array sequence, or another array sequence opposite to the array sequence.

A current adding type D/A converter, according to a third aspect of the present invention, is featured by that in such a current adding type D/A converter having a plurality of current cells made by employing a plurality of constant current sources and a plurality of switches for turning ON the constant current sources, wherein: the current adding type D/A converter is comprised of switch control means; and wherein: in such a case that array numbers defined from "1" to "n" are applied to the plural current cells in the arranging order of the current cells, and the array number "n" is equal to the odd number as well as "(n+1)/2" is equal to the odd number, while combinations of the array numbers in which a summation of two array numbers becomes (n+1) except for the array number "(n+1)/2" are prepared within the plurality of current cells, an array of the array numbers is formed in such a manner that array numbers on the odd number side, or the even number side among the combinations of the current cells are arrayed from a smaller array number so as to form such an array that the array number (n+1)/2 is set at an (n+1)/2-th order; and also the switch control means controls to turn ON the switches of the current cells in accordance with the array sequence, or another array sequence opposite to the array sequence.

A current adding type D/A converter, according to a fourth aspect of the present invention, is featured by that in such a current adding type D/A converter having a plurality of current cells made by employing a plurality of constant current sources and a plurality of switches for turning ON the constant current sources, wherein: the current adding type D/A converter is comprised of switch control means; and wherein: in such a case that array numbers defined from "1" to "n" are applied to the plural current cells in the arranging order of the current cells, and the array number "n" is equal to the odd number as well as "(n+1)/2" is equal to the even number, while combinations of the array numbers in which a summation of two array numbers becomes (n+1) except for the array number "1", the array number "n" and the array number "(n+1)/2" are prepared within the plurality of current cells, and further, the array number "1" is set as either a top number or a last number, an array of the array numbers is formed in such a manner that array numbers on the odd number side, or the even number side among the combinations of the current cells are arrayed from a smaller array number and the array number "n" is arrayed as either the last number or the top number while the array number "(n+1)/2" is set at an (n+1)/2-th order; and also the switch control means controls to turn ON the switches of the current cells in accordance with the array sequence, or another array sequence opposite to the array sequence.

A current adding type D/A converter, according to a fifth aspect of the present invention, is featured by that in the combinations of the current cells in which the summation of the two array numbers becomes (n+1), the combinations are arrayed by mutually and arbitrarily rearranging the sequences thereof.

A current adding type D/A converter, according to a sixth aspect of the present invention, is featured by that in the case that the array number "n" is equal to the even number, the array of said current cells is divided by a power of "2" to obtain current cell groups, and the current cell groups which are located in symmetrical positions with respect to a center point of the array are arrayed by arbitrarily rearranging the sequences of the current cells in a symmetrical manner with respect to the center point.

A current adding type D/A converter, according to a seventh aspect of the present invention, is featured by that in the case that the array number "n" is equal to the odd number, the array of the current cells is divided by a power of "2" except for the array number "(n+1)/2" to obtain current cell groups, and the current cell groups which are located in symmetrical positions with respect to a center point of the array are arrayed by arbitrarily rearranging the sequences of the current cells in a symmetrical manner with respect to the center point.

In the above-explained arrangement, based upon the array set by the switch control means, the switching operation of the current cells is carried out as follows: That is, the switching sequence is determined in such a manner that the current cells having the large fluctuations of the output currents (namely, located on both sides) are turned ON in the order corresponding to such a value nearly equal to either the maximum value or the minimum value of the input data, whereas the current cells having the small fluctuations (located in the vicinity of center point) are turned ON in the order of such a value near the center point. As a result, even in such a case that the fluctuations of the output current amounts are changed along the predetermined direction by the arrangement of the current cells which are caused by the process fluctuations of the D/A converter, the difference in the output current amounts between the current cells becomes small, which are turned ON before/after near the center point of the input data (intermediate between maximum value and minimum value). Also, the fluctuations of the output current amounts among the current cells whose switching sequences are close to each other can be made constant.

In a general-purpose signal processing system, for example, such a signal (periodic signal such as audio signal) having a positive amplitude and a negative amplitude on the maximum value side and also on the minimum value side is employed while sandwiching a center point. The highest appearing frequency degree corresponds to the range in the vicinity of the center point of the input data. This range may correspond to such a normally-used range in which most of input data are concentrated. As a consequence, in accordance with the present invention, the precision of the D/A converter can be improved in the vicinity of the center point corresponding to the normally-used range in the general-purpose signal processing system, and also the distortions as as the noise contained in the output signal can be decreased.

BRIEF DESCRIPTION OF THE DRAWINGS

FIGS. 1(A) and 1(B) show explanatory diagrams for explaining an arranging structure and a switching sequence of current cell employed in a current adding type D/A converter according to a first embodiment mode of the present invention.

FIG. 9(A) and 9(B) show explanatory diagrams for explaining the arranging structure and the switching sequence of current cell employed in the conventional current adding type D/A converter.

DESCRIPTION OF THE PREFERRED EMBODIMENTS

Referring now to drawings, an embodiment mode of the present invention will be described in detail.

FIRST EMBODIMENT MODE

Figure 2:
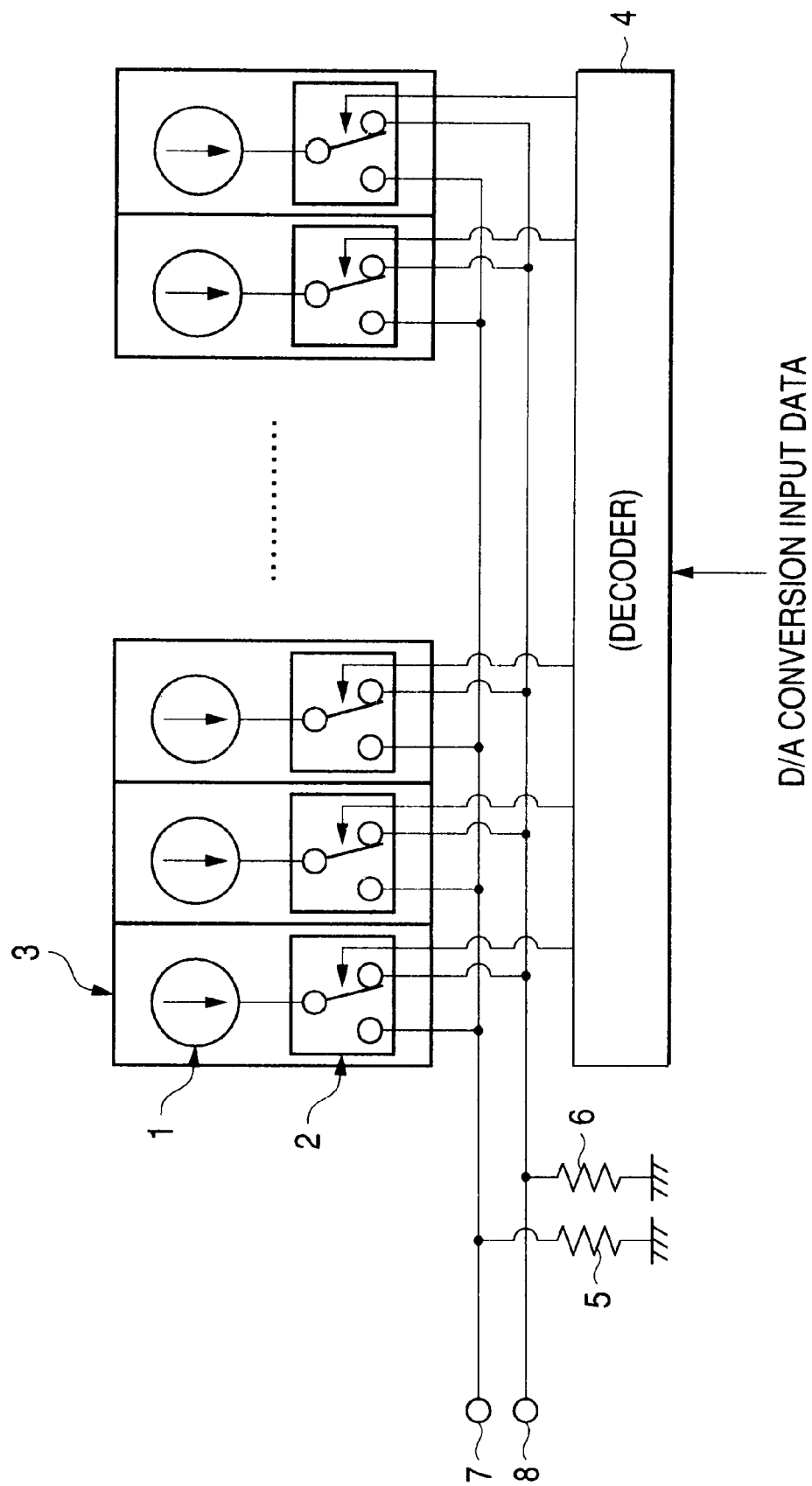
FIG. 2 shows a block diagram for indicating an arrangement of the current adding type D/A converter according to this embodiment mode.

FIG. 1 is an explanatory diagram for representing both an arranging construction and a switching sequence of current cells of a current adding type D/A converter according to a first embodiment mode of the present invention. FIG. 2 is a schematic block diagram for showing a structure of the current adding type D/A converter according to this first embodiment mode.

As indicated in FIG. 2, the current adding type D/A converter is constituted by arranging a plurality of current cells 3. Each of these current cells 3 is constituted by employing a constant current source 1 and a switch 2 for controlling an output of this constant current source 1. Also, the current adding type D/A converter is provided with a switch control unit 4 for controlling the switch 2 of the above-explained current cell 3. This switch control unit 4 is connected to each of the current cells 3. The switches 2 of the respective current cells 3 are connected in such a manner that one terminals thereof are connected to the constant current sources 1, one ends of the other terminals are connected to each other, and these ends are collected to be connected to an output terminal 7. Other ends of the other terminals are similarly collected to each other and are connected to an inverting output terminal 8. An output resistor 5 is connected between a signal line of the output terminal 7, and the ground. An inverting resistor 6 is connected between a signal line of the output terminal 8 and the ground.

In this current adding type D/A converter, the switch control unit 4 constructed of a decoder decodes data which is entered as D/A conversion input data, and switching-controls the switches 2 of the respective current cells 3 so as to operate the constant current source 1. As a result, this D/A converter performs D/A converting operation in such a manner that in response to a value of input data, a current is supplied from a preselected current cell 3 to both the output resistor 5 and the inverting output resistor 6 so as to be converted into a voltage. Then, an output signal defined by an analog voltage value is outputted from both the output terminal 7 and the inverting output terminal 8.

It should be understood that FIG. 2 indicates such an arrangement equipped with both the inverting output terminal and the inverting output resistor, from which the current derived from the current cell under OFF state is outputted. Alternatively, while these inverting output terminal and inverting output resistor are not provided, such a D/A converter having only one output may be arranged.

Next, a description will now be made of switching operation of the current adding type D/A converter according to this first embodiment mode. The first embodiment mode indicates such a case that a total number "n" of current cells is equal to 16 (n=4k, namely multiple number of 4). FIG. 1(A) shows an array sequence of the current cells, and FIG. 1(B) represents a switching sequence of the current cells.

For instance, a current cell 101 through a current cell 116 are made of the same current cells. As indicated in FIG. 2, each of these current cells is constituted by employing a constant current source and a switch used to turn ON this constant current source. These current cells are arranged in the form of, for example, one column in this order of reference numerals 101 to 116. These reference numerals 101 to 116 correspond to array numbers of the current cells. With respect to output current amounts of these current cells, it is so assumed that characteristics are changed at a constant inclination from the current cell 101 to the current cell 116.

Also, numerals [1] to [16] denoted on the respective current cells in FIG. 1(A) correspond to switching numbers, namely represent such a sequence that the current cells are switched. In other words, in response to a value of input data, the current cells shown from the left-end current cell 101 to the right-end current cell 102 are turned ON in the sequential number defined from the switching number [1] to the switching number [16]. FIG. 1(B) shows current cells which are arranged by rearranging the above-described current cells of FIG. 1(A) in another switching order as shown in FIG. 1(B). Reference numerals denoted in the respective current cells show array numbers.

The current adding type D/A converter of this first embodiment mode is featured as follows: That is, when a total number of the current cells is equal to multiple number of "4", the turning-ON sequence of the current cells may cause differences in fluctuations of output current amounts to become constant as to two sets of adjoining current-cell groups (will also be referred to as "pair" hereinafter), and also may decrease output current characteristic changes in the vicinity of a center point of input data.

In an actual circuit, when this actual D/A converter is formed by arranging the current cells from the current cell 101 up to the current cell 116, a process fluctuation may occur along a predetermined direction. As a consequence, since there is a fluctuation in the transistor characteristics of the constant current sources, depending upon the arrangement of the respective current cells, the magnitudes of the output currents of the respective current cells are not always made constant. For example, assuming now that the output current amounts of these current cells are changed by 1% per one current cell, there are errors of 15% in the output current amount of the current cell 116 with respect to the current cell 101.

As a consequence, the switching sequence is determined in such a manner that the current cells having the large fluctuations of the output currents (namely, located on both sides) are turned ON in the order corresponding to such a value nearly equal to either the maximum value or the minimum value, whereas the current cells having the small fluctuations (located in the vicinity of center point) are turned ON in the order of such a value near the center point. As a result, the characteristics such as the differential linearity errors can be improved because of the following reasons. That is, in the vicinity of the center point of the input data, the distances (namely, array numbers) among the current cells whose ON-sequences are continued are close positions, and the difference in the output current amounts every current cell becomes small.

As explained in the first embodiment mode, in the case that a total number of current cells is equal to 16, as to the arranging order shown in FIG. 1(A), the following current cells constitute pair cells from the both ends of the current cell arrangement to the center, namely, both the current cell 101 and the current cell 116 constitute a pair; both the current cell 102 and the current cell 115 constitute a pair; both the current cell 103 and the current cell 114 constitute a pair; both the current cell 104 and the current cell 113 constitute a pair; both the current cell 105 and the current cell 112 constitute a pair; both the current cell 106 and the current cell 111 constitute a pair; both the current cell 107 and the current cell 110 constitute a pair; and both the current cell 108 and the current cell 109 constitute a pair. Among these pairs, the combination of the current cell 101 and the current cell 116 are firstly, or lastly turned ON, which are located at both ends, and own the large fluctuation in the output current amount. It should be noted that in the pair of each current cell, a summation of last two digits of the array number thereof becomes 17 (namely, current cell number+1).

In the switching sequence indicated in FIG. 1(B), as previously explained, the pairs of the combined current cells are indicated under adjoining states, and the current cells corresponding thereto are turned ON in the order of the switching numbers from the minimum value to the maximum value. In this case, the pair of the current cell 101 and the current cell 116 are firstly turned ON.

When D/A conversion input data is entered into the current adding type D/A converter, this input data is decoded by the switch control unit 4, and thus, the corresponding current cell 3 is turned ON. In the case that the input data is "1", the current cell 101 is turned ON. In the case that the input data is "2", both the current cell 101 and the current cell 116 are turned ON. Also, when the input data is equal to "3", the current cell 101, the current cell 116, and the current cell 103 are turned ON. Subsequently, while the data is increased, in accordance with the sequence of the switching number, the current cell 114, the current cell 112, the current cell 105, the current cell 110, the current cell 107, the current cell 108, the current cell 109, the current cell 106, the current cell 111, the current cell 113, the current cell 104, and the current cell 115 are sequentially turned ON. In such a case that the input data becomes 16 equal to the maximum value, the current cell 102 is turned ON, so that all of the current cells are turned ON.

As previously explained, in response to the value of the input data, the summation of the current amounts flowing from a plurality of current cells 101 to 116 is controlled. This current is converted into a voltage by the output resistor 5, so that the D/A converting operation as to the input data is carried out. Thus, the analog output signal can be obtained with respect to the digital input data.

In the above-explained description, the plural current cells are sequentially turned ON from the current cell 101 to the current cell 102 at last in response to the values of the input data from the minimum value to the maximum value. Alternatively, while the switching sequential order is reversed, the plural current cells may be turned ON from the current cell 102 up to the current cell 101.

Also, a modified example is indicated as follows. That is, the switching sequence employed in the above-explained first embodiment mode is slightly changed.

Figure 3:
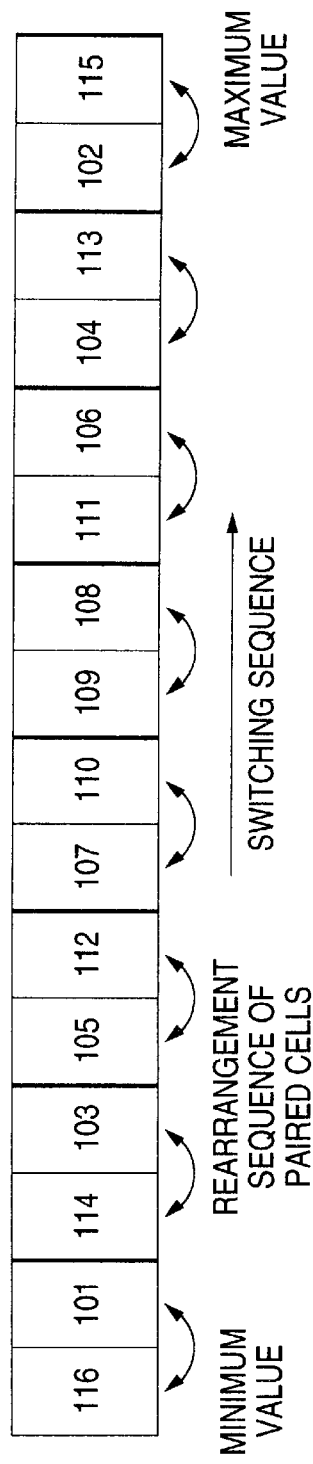
FIGS. 3(A) and 3(B) show explanatory diagrams for showing a first modified example in which the switching sequence used in the first embodiment mode is slightly changed.

FIG. 3 is an explanatory diagram for explaining a switching sequence of a first modified example. This first modification corresponds to such an example that in the above-described embodiment mode shown in FIG. 1, the switching sequence operations at the respective pairs of the adjoining current cells are reversed in an opposite sense, namely, the pair of the current cell 101 and the current cell 116, the pair of the current cell 103 and the current cell 114, - - -, and the like. In this case, the current cell 116, the current cell 101, the current cell 114, the current cell 103, - - -, are turned ON in this order. As previously explained, even when the switching sequence is set in this order, a similar effect to that of the case shown in FIG. 1 is obtained. It should be understood that with respect to the example of FIG. 1, the switching order as to the pairs of the respective current cells shown in FIG. 3 is completely reversed. Alternatively, the switching orders for the pairs of the above-explained current pairs may be properly replaced.

Figure 4:
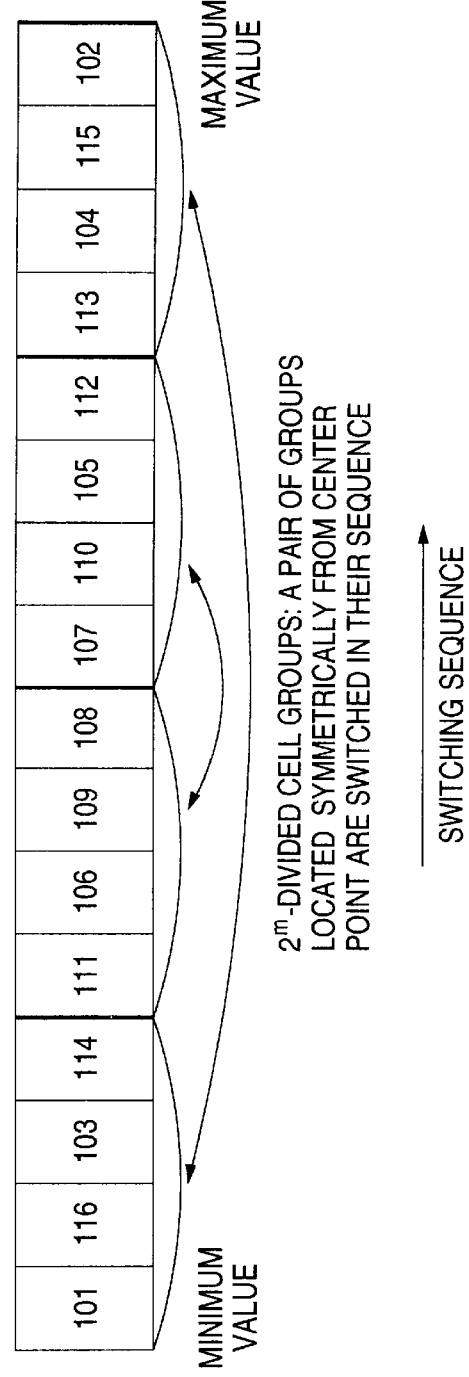
FIGS. 4(A) and 4(B) show explanatory diagrams for showing a second modified example in which the switching sequence used in the first embodiment mode is slightly changed.

FIG. 4 is an explanatory diagram for explaining a switching sequence of a second modified example. This second modification corresponds to such an example that in the above-explained embodiment mode of FIG. 1, the total number of current cells is divided by a power of 2 (namely, $2^m$) (in this case, assuming m=2, $2^2$=4 divisions) while setting the center point of the switching sequence as the boundary, and switching sequences as to two sets of the current cell groups which are located at the symmetrical positions as to this center point are replaced. In FIG. 4, the switching sequences of two current cell groups located on the end sides are similar to those of FIG. 1, the switching sequences of the respective current cells as to only the two current cell groups located on the center side are replaced in the symmetrical manner with respect to the center point. As explained above, even when the switching sequence is set in this manner, a similar effect to that of FIG. 1 may be achieved. It should be noted that as to all of the current cell groups, the switching sequences for the current cell groups which are symmetrically located as to the center point may be replaced.

Figure 5:
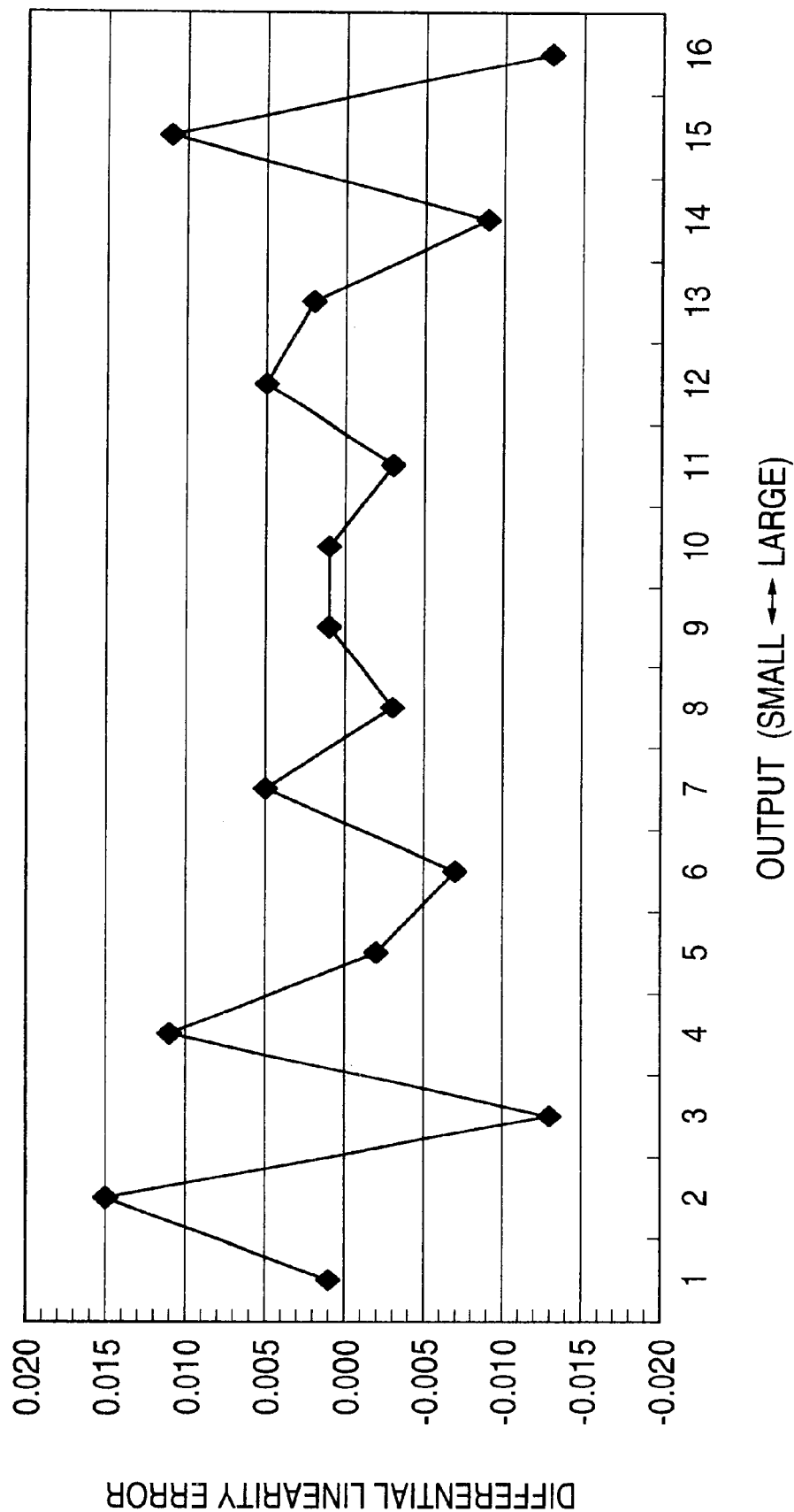
FIG. 5 shows a characteristic diagram for representing a differential linearity error occurred when the D/A converter is operated in accordance with the switching sequence of this embodiment mode.

FIG. 5 is a graphic representation for representing a differential linearity error occurred in the case that the respective current cells are switched in the switching sequence shown in FIG. 1. In this graph, such differential linearity errors are indicated every output value when 1LSB is selected to be 1 in such a case that the output current amounts of the respective current cells are changed by 1% due to the cell arrangement. In FIG. 5, an abscissa indicates a difference between output current amounts of forward/backward current cells namely, adjoining switching orders) by a ratio in the switching sequence of FIG. 1. This difference corresponds to the differential linearity error. An ordinate shows a magnitude of a total output current amount corresponding to a magnitude of input data. In this example, this magnitude is expressed by a total number of such current cells which are turned ON. As indicated in this graphic representation, the differential linearity errors are increased in the vicinity of the maximum value and the minimum value. However, the differential linearity error in the vicinity of the center point becomes small, and the D/A conversion characteristic becomes better.

As previously described, in accordance with this embodiment mode, in the current adding type D/A converter, both the differential linearity errors and the non-linear errors in the vicinity of the center point can be reduced. Also, the output current characteristics which sandwich the center point can be made symmetrical. As a result, the errors caused by the fluctuations in the output current amounts in the usually-operated frequency rage of the D/A converter can be decreased, and the converting precision can be increased so as to improve the characteristic, so that the more suitable output signal can be acquired. For instance, in such a case that a signal having a positive amplitude and a negative amplitude, which sandwiches the center point, (for instance, a periodic signal such as an audio signal) is employed, the characteristic of the D/A converter for the analog output signal can be made symmetrical with respect to positive/negative characteristics. In particular, both the noise and the distortion occurred in the vicinity of the center point can be reduced.

SECOND EMBODIMENT

Figure 6:
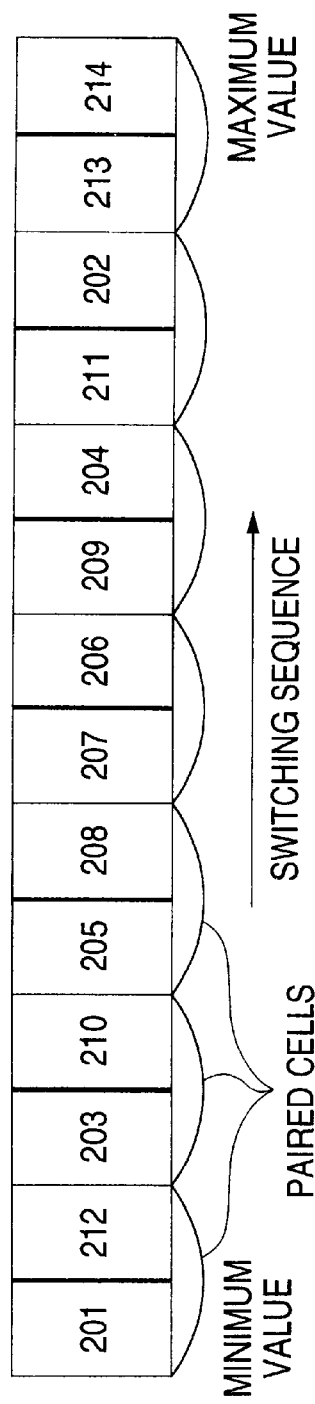
FIGS. 6(A) and 6(B) show explanatory diagrams for explaining an arranging structure and a switching sequence of current cell employed in a current adding type D/A converter according to a second embodiment mode of the present invention.

FIG. 6 is an explanatory diagram for explaining both an arranging structure and a switching sequence of current cells of a current adding type D/A converter according to a second embodiment mode of the present invention.

Next, a description will now be made of switching operation of the current adding type D/A converter according to this second embodiment mode. The second embodiment mode indicates such a case that a total number "n" of current cells is equal to 14 (n=4k-2, namely multiple number of 4-2). FIG. 6(A) shows an array sequence of the current cells, and FIG. 6(13) represents a switching sequence of the current cells.

For instance, a current cell 201 through a current cell 214 are made of the same current cells. As indicated in FIG. 2, each of these current cells is constituted by employing a constant current source and a switch used to turn ON this constant current source. These current cells are arranged in the form of, for example, one column in this order of reference numerals 201 to 214. These reference numerals 201 to 214 correspond to array numbers of the current cells. With respect to output current amounts of these current cells, it is so assumed that characteristics are changed at a constant inclination from the current cell 201 to the current cell 214.

Also, numerals [1] to [14] denoted on the respective current cells in FIG. 6(A) correspond to switching numbers, namely represent such a sequence that the current cells are switched. In other words, in response to a value of input data, the current cells defined from the current cell 201 to the current cell 214 are turned ON in the sequential number defined from the switching number [1] to the switching number [14]. FIG. 6(B) shows current cells which are arranged by rearranging the above-described current cells of FIG. 6(A) in another switching order as shown in FIG. 6(13). Reference numerals denoted in the respective current cells show array numbers.

The current adding type D/A converter of this second embodiment mode is featured as follows: That is, when a total number of the current cells is equal to multiple number of "4"-2, the turning-ON sequence of the current cells may cause differences in fluctuations of output current amounts to become constant as to two sets of adjoining current-cell groups and also may decrease output current characteristic changes in the vicinity of a center point of input data.

In an actual circuit, when this actual D/A converter is formed by arranging the current cells from the current cell 201 up to the current cell 214, a process fluctuation may occur along a predetermined direction, and also there is a fluctuation in the transistor characteristics of the constant current sources, depending upon the arrangement of the respective current cells. For example, assuming now that the output current amounts of these current cells are changed by 1% per one current cell, there are errors of 13% in the output current amount of the current cell 214 with respect to the current cell 201.

As a consequence, similar to the first embodiment mode, in this second embodiment mode, the switching sequence is determined in such a manner that the current cells having the large fluctuations of the output currents (namely, located on both sides) are turned ON in the order corresponding to such a value nearly equal to either the maximum value or the minimum value, whereas the current cells having the small fluctuations (located in the vicinity of center point) are turned ON in the order of such a value near the center point. As a result, the characteristics such as the differential linearity errors can be improved because of the following reasons. That is, in the vicinity of the center point of the input data, the distances (namely, array numbers) among the current cells whose ON-sequences are continued are close positions, and the difference in the output current amounts every current cell becomes small.

As explained in the second embodiment mode, in the case that a total number of current cells is equal to 14, as to the arranging order shown in FIG. 6(A), the following current cells constitute pair cells from the both ends of the current cell arrangement to the center, namely, both the current cell 201 and the current cell 214 constitute a pair; both the current cell 202 and the current cell 321 constitute a pair; both the current cell 203 and the current cell 212 constitute a pair; both the current cell 204 and the current cell 211 constitute a pair; both the current cell 205 and the current cell 210 constitute a pair; both the current cell 206 and the current cell 209 constitute a pair; and both the current cell 207 and the current cell 208 constitute a pair.

When these paired current cells are divided by 2, the divided current cells become odd numbers. As a result, the current cell 201 and the current cell 214 (which are located at both ends) which own large fluctuations of output current amounts are subdivided. One of these paired current cells is firstly turned ON, and the other current cell is finally turned ON. Then, such a switching order is set as follows: That is, a combination between the current cell 202 and the current cell 213 (which are secondly located on both sides), which own the large fluctuation of the output current amounts is turned ON in a second switching order and a third switching order, or in a 12-th switching order and a 13-th switching order among the remaining paired current cells. It should be noted that in the pair of each current cell, a summation of last two digits of the array number thereof becomes 25 (namely, current cell number+1).

In the switching sequence indicated in FIG. 6(B), as previously explained, the pairs of the combined current cells are indicated under adjoining states, and the current cells corresponding thereto are turned ON in the order of the switching numbers from the minimum value to the maximum value. In this case, the current cell 201 is firstly turned ON, and the pair of the current cell 202 and the current cell 213 are turned ON in the second switching order and the third switching order. The pair of the current cell 202 and the current cell 213 are turned ON in the 12-th switching order and the 13-th switching order.

When D/A conversion input data is entered into the current adding type D/A converter, this input data is decoded by the switch control unit 4, and thus, the corresponding current cell 3 is turned ON. In the case that the input data is "1", the current cell 201 is turned ON. In the case that the input data is "2", both the current cell 201 and the current cell 212 are turned ON. Also, when the input data is equal to "3", the current cell 201, the current cell 212, and the current cell 203 are turned ON. Subsequently, while the data is increased, in accordance with the sequence of the switching number, the current cell 210, the current cell 205, the current cell 208, the current cell 207, the current cell 206, the current cell 209, the current cell 204, the current cell 211, the current cell 202, and the current cell 213 are sequentially turned ON. In such a case that the input data becomes 14 equal to the maximum value, the current cell 214 is turned ON, so that all of the current cells are turned ON.

As previously explained, in response to the value of the input data, the summation of the current amounts flowing from a plurality of current cells 201 to 214 is controlled. This current is converted into a voltage by the output resistor 5, so that the D/A converting operation as to the input data is carried out. Thus, the analog output signal can be obtained with respect to the digital input data.

In the above-explained description, the plural current cells are sequentially turned ON from the current cell 201 to the current cell 214 at last in response to the values of the input data from the minimum value to the maximum value. Alternatively, while the switching sequential order is reversed, the plural current cells may be turned ON from the current cell 214 up to the current cell 201.

As shown in the above-described first modification of the first embodiment mode shown in FIG. 1, the switching sequence operations at the respective pairs of the adjoining current cells are reversed in an opposite sense, namely, the pair of the current cell 212 and the current cell 203, the pair of the current cell 210 and the current cell 205, - - -, and the like. Even when the switching sequence is set in this order, a similar effect to that of the case shown in FIG. 1 is obtained.

Also, as represented in a second modification of the first embodiment mode, a similar effect may be obtained even in such a case that the total number of current cells is divided by a power of 2 (in this case, either ½ subdivision or ¼ subdivision) while setting the center point of the switching sequence as the boundary, and switching sequences as to two sets of the current cell groups which are located at the symmetrical positions as to this center point are replaced.

Also, in the second embodiment mode, when the current cells are combined as the pairs, a total number of these paired current cells becomes the odd numbers while setting a center point as a boundary, and therefore, the current cells located at both ends become extra current cells. As a result, even when the switching sequence orders as to the current cell 201 and the current cell 214, which are located on both ends, are replaced with each other, a similar effect may be obtained. This current cell 201 is turned ON at a minimum value, whereas the current cell 214 is turned ON at a maximum value.

Similar to the first embodiment mode, also in this second embodiment mode, as previously described, in the current adding type D/A converter, both the differential linearity errors and the non-linear errors in the vicinity of the center point can be reduced. Also, the output current characteristics which sandwich the center point can be made symmetrical. As a result, the errors caused by the fluctuations in the output current amounts in the usually operated frequency rage of the D/A converter can be decreased, and the converting precision can be increased so as to improve the characteristic, so that the more suitable output signal can be acquired. For instance, in such a case that a signal having a positive amplitude and a negative amplitude, which sandwiches the center point, (for instance, a periodic signal such as an audio signal) is employed, the characteristic of the D/A converter for the analog output signal can be made symmetrical with respect to positive/negative characteristics. In particular, both the noise and the distortion occurred in the vicinity of the center point can be reduced.

THIRD EMBODIMENT

Figure 7:
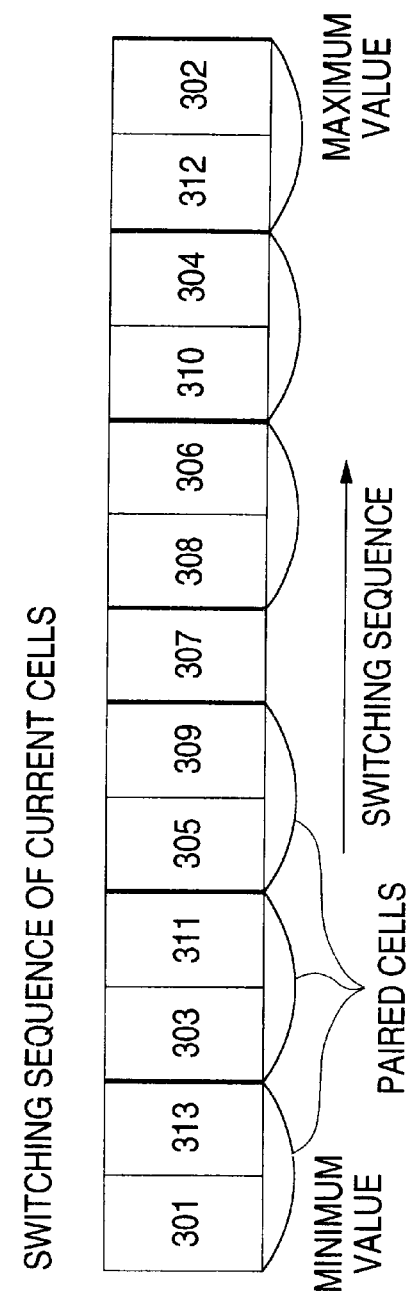
FIG. 7(A) and 7(B) shows explanatory diagrams for explaining an arranging structure and a switching sequence of current cell employed in a current adding type D/A converter according to a third embodiment mode of the present invention.

FIG. 7 is an explanatory diagram for explaining both an arranging structure and a switching sequence of current cells of a current adding type D/A converter according to a third embodiment mode of the present invention.

The third embodiment mode indicates such a case that a total number "n" of current cells is equal to 13 (n=4k−3, namely multiple number of 4−3). FIG. 7(A) shows an array sequence of the current cells, and FIG. 7(B) represents a switching sequence of the current cells.

For instance, a current cell 301 through a current cell 313 are made of the same current cells. As indicated in FIG. 2, each of these current cells is constituted by employing a constant current source and a switch used to turn ON this constant current source. These current cells are arranged in the form of, for example, one column in this order of reference numerals 301 to 313. These reference numerals 301 to 313 correspond to array numbers of the current cells. With respect to output current amounts of these current cells, it is so assumed that characteristics are changed at a constant inclination from the current cell 301 to the current cell 313.

Also, numerals [1] to [13] denoted on the respective current cells in FIG. 7(A) correspond to switching numbers, namely represent such a sequence that the current cells are switched. In other words, in response to a value of input data, the current cells defined from the current cell 301 to the current cell 302 are turned ON in the sequential number defined from the switching number [1] to the switching number [13]. FIG. 7(B) shows current cells which are arranged by rearranging the above-described current cells of FIG. 7(A) in another switching order as shown in FIG. 7(B). Reference numerals denoted in the respective current cells show array numbers.

The current adding type D/A converter of this third embodiment mode is featured as follows: That is, when a total number of the current cells is equal to multiple number of "4"−3, the turning-ON sequence of the current cells may cause differences in fluctuations of output current amounts to become constant as to two sets of adjoining current-cell groups, and also may decrease output current characteristic changes in the vicinity of a center point of input data.

In an actual circuit, when this actual D/A converter is formed by arranging the current cells from the current cell 301 up to the current cell 313, a process fluctuation may occur along a predetermined direction. As a consequence, since there is a fluctuation in the transistor characteristics of the constant current sources, depending upon the arrangement of the respective current cells, the magnitudes of the output currents of the respective current cells are not always made constant. For example, assuming now that the output current amounts of these current cells are changed by 1% per one current cell, there are errors of 12% in the output current amount of the current cell 301 with respect to the current cell 313.

As a consequence, similar to the first embodiment mode, also in this embodiment mode, the switching sequence is determined in such a manner that the current cells having the large fluctuations of the output currents (namely, located on both sides) are turned ON in the order corresponding to such a value nearly equal to either the maximum value or the minimum value, whereas the current cells having the small fluctuations (located in the vicinity of center point) are turned ON in the order of such a value near the center point. As a result, the characteristics such as the differential linearity errors can be improved because of the following reasons. That is, in the vicinity of the center point of the input data, the distances (namely, array numbers) among the current cells whose ON-sequences are continued are close positions, and the difference in the output current amounts every current cell becomes small.

As explained in the third embodiment mode, in the case that a total number of current cells is equal to 13, as to the arranging order shown in FIG. 7(A), the following current cells constitute pair cells from the both ends of the current cell arrangement to the center, namely, both the current cell 301 and the current cell 313 constitute a pair; both the current cell 302 and the current cell 312 constitute a pair; both the current cell 303 and the current cell 311 constitute a pair; both the current cell 304 and the current cell 310 constitute a pair; both the current cell 305 and the current cell 309 constitute a pair; and both the current cell 306 and the current cell 308 constitute a pair. It should be noted that in the pair of each current cell, a summation of last two digits of the array number thereof becomes 14 (namely, current cell number+1). Then, the switching sequence is determined in this manner that the remaining central current cell 307 is turned ON at a center point. Among these paired current cells, such a combination between the current cell 301 and the current cell 313 are firstly, or finally turned ON, which are located at both ends and own the large fluctuations in the output current amounts.

In the switching sequence indicated in FIG. 7(B), as previously explained, the pairs of the combined current cells are indicated under adjoining states, and the current cells corresponding thereto are turned ON in the order of the switching numbers from the minimum value to the maximum value. In this case, the pair of the current cell 301 and the current cell 313 are firstly turned ON.

When D/A conversion input data is entered into the current adding type D/A converter, this input data is decoded by the switch control unit 4, and thus, the corresponding current cell 3 is turned ON. In the case that the input data is "1", the current cell 301 is turned ON. In the case that the input data is "2", both the current cell 301 and the current cell 313 are turned ON. Also, when the input data is equal to "3", the current cell 301, the current cell 313, and the current cell 303 are turned ON. Subsequently, while the data is increased, in accordance with the sequence of the switching number, the current cell 311, the current cell 305, the current cell 305, the current cell 307, the current cell 308, the current cell 306, the current cell 310, the current cell 304, and the current cell 312 are sequentially turned ON. In such a case that the input data becomes 13 equal to the maximum value, the current cell 302 is turned ON, so that all of the current cells are turned ON.

As previously explained, in response to the value of the input data, the summation of the current amounts flowing from a plurality of current cells 301 to 313 is controlled. This current is converted into a voltage by the output resistor 5, so that the D/A converting operation as to the input data is carried out. Thus, the analog output signal can be obtained with respect to the digital input data.

In the above-explained description, the plural current cells are sequentially turned ON from the current cell 301 to the current cell 302 at last in response to the values of the input data from the minimum value to the maximum value. Alternatively, while the switching sequential order is reversed, the plural currents may be turned ON from the current cell 302 up to the current cell 301.

As represented in the above-described first modification of the first embodiment mode shown in FIG. 1, the switching sequence operations at the respective pairs of the adjoining current cells are reversed in an opposite sense, namely, the pair of the current cell 301 and the current cell 313, the pair of the current cell 303 and the current cell 311, - - -, and the like. Even when the switching sequence is set in this order, a similar effect to that of the case shown in FIG. 1 is obtained.

Also, as represented in a second modification of the first embodiment mode, a similar effect may be obtained even in such a case that the total number of current cells is divided by a power of 2 (in this case, either ½ subdivision or ¼ subdivision except for central current cell) while setting the center point of the switching sequence as the boundary, and switching sequences as to two sets of the current cell groups which are located at the symmetrical positions as to this center point are replaced.

As previously described, similar to the first embodiment mode, also in accordance with this embodiment mode, in the current adding type D/A converter, both the differential linearity errors and the non-linear errors in the vicinity of the center point can be reduced. Also, the output current characteristics which sandwich the center point can be made symmetrical. As a result, the errors caused by the fluctuations in the output current amounts in the usually-operated frequency rage of the D/A converter can be decreased, and the converting precision can be increased so as to improve the characteristic, so that the more suitable output signal can be acquired. For instance, in such a case that a signal having a positive amplitude and a negative amplitude, which sandwiches the center point, (for instance, a periodic signal such as an audio signal) is employed, the characteristic of the D/A converter for the analog output signal can be made symmetrical with respect to positive/negative characteristics. In particular, both the noise and the distortion occurred in the vicinity of the center point can be reduced.

FOURTH EMBODIMENT

Figure 8:
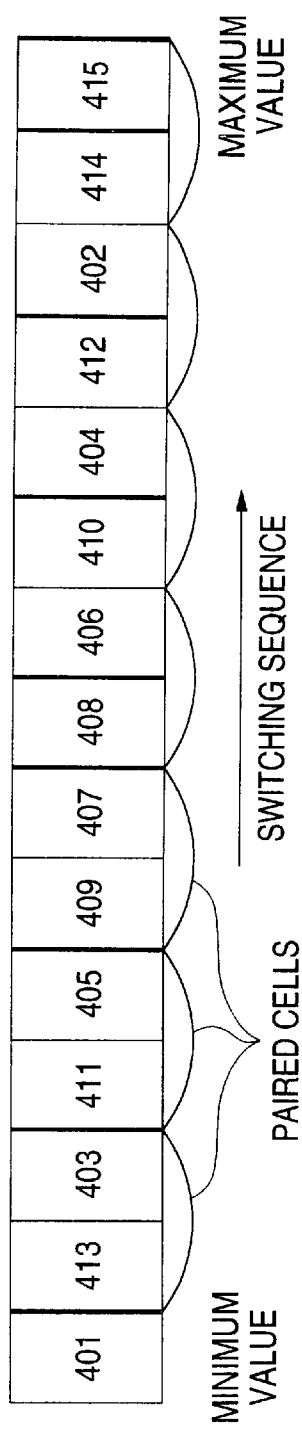
FIG. 8(A) and 8(B) shows explanatory diagrams for explaining an arranging structure and a switching sequence of current cell employed in a current adding type D/A converter according to a fourth embodiment mode of the present invention.
Figure 10:
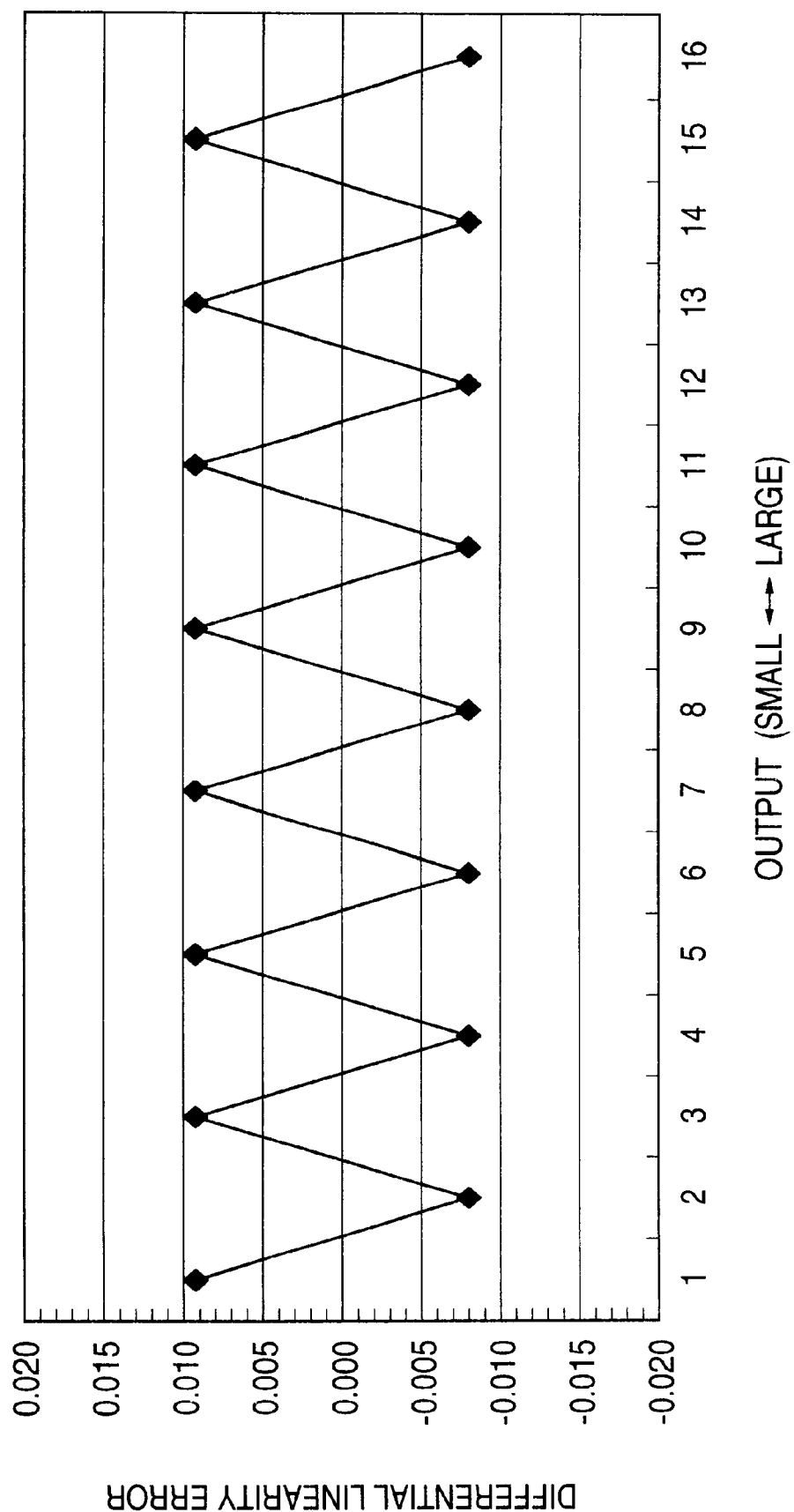
FIG. 10 shows a characteristic diagram for representing the differential linearity error occurred when the conventional D/A converter is operated in accordance with the switching sequence of this prior art.

FIG. 8 is an explanatory diagram for explaining both an arranging structure and a switching sequence of current cells of a current adding type D/A converter according to a fourth embodiment mode of the present invention.

The fourth embodiment mode indicates such a case that a total number "n" of current cells is equal to 15 (n=4k−1, namely multiple number of "4"−1). FIG. 8(A) shows an array sequence of the current cells, and FIG. 1(B) represents a switching sequence of the current cells.

For instance, a current cell 401 through a current cell 415 are made of the same current cells. As indicated in FIG. 2, each of these current cells is constituted by employing a constant current source and a switch used to turn ON this constant current source. These current cells are arranged in the form of, for example, one column in this order of reference numerals 401 to 415. These reference numerals 401 to 415 correspond to array numbers of the current cells. With respect to output current amounts of these current cells, it is so assumed that characteristics are changed at a constant inclination from the current cell 401 to the current cell 415.

Also, numerals [1] to [15] denoted on the respective current cells in FIG. 8(A) correspond to switching numbers, namely represent such a sequence that the current cells are switched. In other words, in response to a value of input data, the current cells defined from the current cell 401 to the current cell 415 are turned ON in the sequential number defined from the switching number [1] to the switching number [15]. FIG. 8(1) shows current cells which are arranged by rearranging the above-described current cells of FIG. 8(A) in another switching order as shown in FIG. 8(B). Reference numerals denoted in the respective current cells show array numbers.

The current adding type D/A converter of this fourth embodiment mode is featured as follows: That is, when a total number of the current cells is equal to multiple number of "4"−1, the turning-ON sequence of the current cells may cause differences in fluctuations of output current amounts to become constant as to two sets of adjoining current-cell groups, and also may decrease output current characteristic changes in the vicinity of a center point of input data.

In an actual circuit, when this actual D/A converter is formed by arranging the current cells from the current cell 401 up to the current cell 415, a process fluctuation may occur along a predetermined direction. As a consequence, since there is a fluctuation in the transistor characteristics of the constant current sources, depending upon the arrangement of the respective current cells, the magnitudes of the output currents of the respective current cells are not always made constant. For example, assuming now that the output current amounts of these current cells are changed by 1% per one current cell, there are errors of 14% in the output current amount of the current cell 415 with respect to the current cell 401.

As a consequence, similar to the first embodiment mode, also in the fourth embodiment mode, the switching sequence is determined in such a manner that the current cells having the large fluctuations of the output currents (namely, located on both sides) are turned ON in the order corresponding to such a value nearly equal to either the maximum value or the minimum value, whereas the current cells having the small fluctuations (located in the vicinity of center point) are turned ON in the order of such a value near the center point. As a result, the characteristics such as the differential linearity errors can be improved because of the following reasons. That is, in the vicinity of the center point of the input data, the distances (namely, array numbers) among the current cells whose ON-sequences are continued are close positions, and the difference in the output current amounts every current cell becomes small.

As explained in the fourth embodiment mode, in the case that a total number of current cells is equal to 15, as to the arranging order shown in FIG. 8(A), the following current cells constitute pair cells from the both ends of the current cell arrangement to the center, namely, both the current cell 401 and the current cell 415 constitute a pair; both the current cell 402 and the current cell 414 constitute a pair; both the current cell 403 and the current cell 413 constitute a pair; both the current cell 404 and the current cell 412 constitute a pair; both the current cell 405 and the current cell 411 constitute a pair; both the current cell 406 and the current cell 410 constitute a pair; and both the current cell 407 and the current cell 409 constitute a pair. It should be noted that in the pair of each current cell, a summation of last two digits of the array number thereof becomes 16 (namely, current cell number+1).

Then, the switching sequence is set in such a manner that the remaining center current cell 408 is turned ON at the center point. When these paired current cells are divided by 2, the divided current cells become odd numbers. As a result, the current cell 401 and the current cell 415 (which are located at both ends) which own large fluctuations of output current amounts are subdivided. One of these paired current cells is firstly turned ON, and the other current cell is finally turned ON. Then, such a switching order is set as follows: That is, a combination between the current cell 402 and the current cell 414 (which are secondly located on both sides), which own the large fluctuation of the output current amounts is turned ON in a second switching order and a third switching order, or in a 13-th switching order and a 14-th switching order among the remaining paired current cells.

In the switching sequence indicated in FIG. 8(B), as previously explained, the pairs of the combined current cells are indicated under adjoining states, and the current cells corresponding thereto are turned ON in the order of the switching numbers from the minimum value to the maximum value. In this case, the current cell 401 is firstly turned ON. Subsequently, the pair of both the current cell 413 and the current cell 403 are turned ON in a second switching order and a third switching order. The pair of both the current cell 402 and the current cell 414 are turned ON in a 13-th switching order and a 14-th switching order.

When D/A conversion input data is entered into the current adding type D/A converter, this input data is decoded by the switch control unit 4, and thus, the corresponding current cell 3 is turned ON. In the case that the input data is "1", the current cell 401 is turned ON. In the case that the input data is "2", both the current cell 401 and the current cell 413 are turned ON. Also, when the input data is equal to "3", the current cell 401, the current cell 413, and the current cell 403 are turned ON. Subsequently, while the data is increased, in accordance with the sequence of the switching number, the current cell 411, the current cell 405, the current cell 409, the current cell 407, the current cell 408, the current cell 406, the current cell 410, the current cell 404, the current cell 412, the current cell 402, and the current cell 414 are sequentially turned ON. In such a case that the input data becomes 15 equal to the maximum value, the current cell 415 is turned ON, so that all of the current cells are turned ON.

As previously explained, in response to the value of the input data, the summation of the current amounts flowing from a plurality of current cells 401 to 415 is controlled. This current is converted into a voltage by the output resistor 5, so that the D/A converting operation as to the input data is carried out. Thus, the analog output signal can be obtained with respect to the digital input data.

In the above-explained description, the plural current cells are sequentially turned ON from the current cell 401 to the current cell 415 at last in response to the values of the input data from the minimum value to the maximum value. Alternatively, while the switching sequential order is reversed, the plural currents may be turned ON from the current cell 415 up to the current cell 401.

As indicated in the above-explained first modification of the first embodiment mode, the switching sequence operations at the respective pairs of the adjoining current cells are reversed in an opposite sense, namely, the pair of the current cell 413 and the current cell 403, the pair of the current cell 411 and the current cell 405, - - - , and the like. Even when the switching sequence is set in this order, a similar effect to that of the case shown in FIG. 1 is obtained.

Also, as represented in the second modification of the first embodiment mode, a similar effect may be obtained even in such a case that the total number of current cells is divided by a power of 2 (in this case, either ½ subdivision or ¼ subdivision except for central current cell) while setting the center point of the switching sequence as the boundary, and switching sequences as to two sets of the current cell groups which are located at the symmetrical positions as to this center point are replaced.

Also, in the fourth embodiment mode, when the current cells are combined as the pairs, a total number of these paired current cells becomes the odd numbers while setting a center point as a boundary, and therefore, the current cells located at both ends become extra current cells. As a result, even when the switching sequence orders as to the current cell 401 and the current cell 415, which are located on both ends, are replaced with each other, a similar effect may be obtained. This current cell 401 is turned ON at a minimum value, whereas the current cell 415 is turned ON at a maximum value.

Similar to the first embodiment mode, also in this fourth embodiment mode, as previously described, in the current adding type D/A converter, both the differential linearity errors and the non-linear errors in the vicinity of the center point can be reduced. Also, the output current characteristics which sandwich the center point can be made symmetrical. As a result, the errors caused by the fluctuations in the output current amounts in the usually-operated frequency rage of the D/A converter can be decreased, and the converting precision can be increased so as to improve the characteristic, so that the more suitable output signal can be acquired. For instance, in such a case that a signal having a positive amplitude and a negative amplitude, which sandwiches the center point, (for instance, a periodic signal such as an audio signal) is employed, the characteristic of the D/A converter for the analog output signal can be made symmetrical with respect to positive/negative characteristics. In particular, both the noise and the distortion occurred in the vicinity of the center point can be reduced.

In accordance with the above-described respective embodiment modes, in the current adding type D/A converter, the precision thereof can be improved in the vicinity of the center point of the input signal range, and also the distortions of the corresponding output signals can be reduced. In applications of general-purpose signal processing systems, there are many cases that the precision of this D/A converter required when an output signal owns a small amplitude may become more important than that required when an output signal owns a large amplitude. Even when the precision of the D/A converters itself is identical to each other, generally speaking, the characteristic obtained when the output signal owns the small amplitude corresponding to the normally-used range can be improved.

It should also be noted that the above-explained embodiment modes exemplify the four modes in which a total number of these current cells is selected to be 13 to 14. Even when any other current cell numbers are employed, these current cells may be constituted by being adapted to any of the above-explained first to fourth embodiment modes.

As previously described in detail, in accordance with the present invention, there are the following effects. That is, while the differential linearity errors occurred in the vicinity of the center point of the input data can be decreased, such a current adding type D/A converter capable of improving the characteristic in the normally-used range, e.g., when the output signal owns the small amplitude can be provided.

What is claimed is:

1. A current adding type D/A converter comprising of:
    a plurality of current cells which are comprised of a plurality of constant current sources;
    a plurality of switches for turning on said plurality of current cells, and
    switch control means for controlling said plurality of switches in accordance with a predetermined switching sequence, wherein
    array numbers defined as natural numbers from "1" to "n" are assigned to said plurality of current cells in an arrangement order thereof, and said array number of "n" is equal to an even number of which value of "n/2" is equal to another even number,
    while a plurality of combinations of said array numbers are produced in such a way that each combination is exclusively includes two of the array numbers of which summation becomes (n+1), and said plurality of combinations are aligned along an increment order based on either odd numbers or even numbers, both of which are among said plurality of combinations, further wherein
    said predetermined switching sequence is corresponding to said increment order or inverted order thereof.

2. A current adding type D/A converter comprising of:
    a plurality of current cells which are comprised of a plurality of constant current sources;
    a plurality of switches for turning on said plurality of current cells, and
    switch control means for controlling said plurality of switches in accordance with a predetermined switching sequence; and wherein:
        array numbers defined as natural numbers from "1" to "n" are assigned to said plurality of current cells in an arrangement order thereof, and said array number of "n" is equal to an even number of which value of "n/2" is equal to another even number,
        while a plurality of combinations of said array numbers are produced in such a way that each combination exclusively includes two of the array numbers, excluding "1" and "n", of which summation becomes (n+1), and said plurality of combinations are aligned along an increment order with either starting from "1" being based on odd numbers, or ending with "n" being based on even numbers, both of which are among said plurality of combinations, further wherein
            said predetermined switching sequence is corresponding to said increment order or inverted order thereof.

3. A current adding type D/A converter comprising of:
    a plurality of current cells which are comprised of a plurality of constant current sources;
    a plurality of switches for turning on said plurality of current cells, and
    switch control means for controlling said plurality of switches in accordance with a predetermined switching sequence, wherein
    array numbers defined as natural numbers from "1" to "n" are assigned to said plurality of current cells in an arrangement order thereof, and said array number of "n" is equal to an odd number of which value of "(n+1)/2" is equal to another odd number,
    while a plurality of combinations of said array numbers are produced in such a way that each combination is exclusively includes two of the array numbers, excluding said value of "(n+1)/2", of which summation becomes (n+1), and said plurality of combinations are aligned along an increment order based on either odd numbers or even numbers, both of which are among said plurality of combinations, further wherein
        said predetermined switching sequence is corresponding to said increment order or inverted order thereof with exception such that a current cell having an array number of said value "(n+1)/2" is switched before a (n+1)/2th order.

4. A current adding type D/A converter comprising of:
    a plurality of current cells which are comprised of a plurality of constant current sources;
    a plurality of switches for turning on said plurality of current cells, and
    switch control means for controlling said plurality of switches in accordance with a predetermined switching sequence, wherein
    array numbers defined as natural numbers from "1" to "n" are assigned to said plurality of current cells in an arrangement order thereof, and said array number of "n" is equal to an odd number of which value of "(n+1)/2" is equal to an even number,
    while a plurality of combinations of said array numbers are produced in such a way that each combination is exclusively includes two of the array numbers, excluding said value of "(n+1)/2", of which summation becomes (n+1), and said plurality of combinations are aligned along an increment order with either starting from "1" being based on odd numbers, or ending with "n" being based on even numbers, both of which are among said plurality of combinations, further wherein
        said predetermined switching sequence is corresponding to said increment order or inverted order thereof with exception such that a current cell having an array number of said value "(n+1)/2" is switched before a (n+1)/2th order.

5. A current adding type D/A converter as claimed in any one of claims 1 to 4 wherein:
    in each combination of said array numbers, a sequence of current cells being assigned by said combination are rearranged arbitrarily with any other.

6. A current adding type D/A converter as claimed in claim 1, or claim 2 wherein:
    in the case that said array number "n" is equal to the even number, the array of said current cells is divided by a power of "2" to obtain current cell groups, and the current cell groups which are located in symmetrical positions with respect to a center point of said array are arrayed by arbitrarily rearranging the sequences of the current cells in a symmetrical manner with respect to said center point.

7. A current adding type D/A converter as claimed in claim 3, or claim 4 wherein:
    in the case that said array number "n" is equal to the odd number, the array of said current cells is divided by a power of "2" except for said array number "(n+1)/2" to obtain current cell groups, and the current cell groups which are located in symmetrical positions with respect to a center point of said array are arrayed by arbitrarily rearranging the sequences of the current cells in a symmetrical manner with respect to said center point.

* * * * *

UNITED STATES PATENT AND TRADEMARK OFFICE
CERTIFICATE OF CORRECTION

PATENT NO. : 6,452,527 B2
DATED : September 17, 2002
INVENTOR(S) : Akifumi Takeya et al.

It is certified that error appears in the above-identified patent and that said Letters Patent is hereby corrected as shown below:

Column 2,
Line 66, please delete "SIN", and insert therefor -- S/N --.

Column 9,
Line 52, please delete "namely,", and insert therefor -- (namely, --.

Column 10,
Lines 29 and 51, please delete "6(13)", and insert therefor -- 6(B) --.

Column 11,
Line 28, please delete "321", and insert therefor -- 213 --.

Column 16,
Line 6, please delete "8(1)", and insert therefor -- 8(B) --.

Signed and Sealed this

Eleventh Day of March, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,452,527 B2  
DATED        : September 17, 2002  
INVENTOR(S)  : Akifumi Takeya et al.

It is certified that error appears in the above-identified patent and that said Letters Patent is hereby corrected as shown below:

<u>Title page, Item [54] and Column 1, line 1,</u>  
Please delete the title "CURRENT ADDING TYPE D/A CONVERTER" and insert therefor -- CURRENT SUMMING D/A CONVERTER USING A DISTRIBUTED CELL SWITCHING SEQUENCE --.

Signed and Sealed this

Ninth Day of September, 2003

JAMES E. ROGAN  
*Director of the United States Patent and Trademark Office*